(12) United States Patent
Eggers et al.

(10) Patent No.: US 11,906,607 B2
(45) Date of Patent: Feb. 20, 2024

(54) EFFICIENT SELF-REFOCUSING ZERO ECHO TIME MR IMAGING

(71) Applicant: KONINKLIJKE PHILIPS N.V., Eindhoven (NL)

(72) Inventors: Holger Eggers, Ellerhoop (DE); Kay Nehrke, Ammersbek (DE); Peter Boernert, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 133 days.

(21) Appl. No.: 17/609,527

(22) PCT Filed: May 6, 2020

(86) PCT No.: PCT/EP2020/062479
§ 371 (c)(1),
(2) Date: Nov. 8, 2021

(87) PCT Pub. No.: WO2020/225268
PCT Pub. Date: Nov. 12, 2020

(65) Prior Publication Data
US 2022/0308141 A1   Sep. 29, 2022

(30) Foreign Application Priority Data

May 9, 2019   (EP) ..................................... 19173479

(51) Int. Cl.
*G01V 3/00*      (2006.01)
*G01R 33/48*     (2006.01)
*G01R 33/54*     (2006.01)

(52) U.S. Cl.
CPC ..... *G01R 33/4826* (2013.01); *G01R 33/4816* (2013.01); *G01R 33/543* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS

| 2013/0116545 A1* | 5/2013 | Xu ........................ A61B 5/7289 |
| | | 600/413 |
| 2015/0115956 A1* | 4/2015 | Ackerman ............. G01R 33/42 |
| | | 324/309 |

(Continued)

FOREIGN PATENT DOCUMENTS

WO      2017186768 A2     11/2017

OTHER PUBLICATIONS

Schulte et al "Silent T2 and T2 Encoding Using ZTE Combined With Burst" Magnetic Resonance in Med. 2018 p. 1-11.

(Continued)

*Primary Examiner* — Walter L Lindsay, Jr.

(57) ABSTRACT

The invention relates to a method of MR imaging of an object positioned in an examination volume of a MR device (1). It is an object of the invention to enable efficient silent ZTE imaging with self-refocusing. The method of the invention comprises the steps of:—specification of a set of radial k-space spokes to cover a spherical k-space volume;—selection of subsets of a predetermined number of spokes from the specified set so that the concatenation of the spokes contained in each of the subsets forms a closed trajectory in k-space, wherein the selection of the subsets involves optimizing a cost function;—subjecting the object (10) to a zero echo time imaging sequence, wherein each of the subsets of spokes is acquired as a sequence of gradient echo signals; and—reconstructing an MR image from the acquired spokes. Moreover, the invention relates to a MR device and to a computer program for a MR device.

20 Claims, 3 Drawing Sheets

(58) Field of Classification Search
USPC .......................................................... 324/309
See application file for complete search history.

(56) References Cited

U.S. PATENT DOCUMENTS

| | | | |
|---|---|---|---|
| 2015/0276909 A1* | 10/2015 | Kawaji | A61B 5/024 |
| | | | 600/416 |
| 2016/0341806 A1 | 11/2016 | Smink et al. | |
| 2017/0089993 A1 | 3/2017 | McKinnon et al. | |
| 2017/0261577 A1 | 9/2017 | Smink et al. | |
| 2017/0307703 A1 | 10/2017 | Wiesinger et al. | |

OTHER PUBLICATIONS

Wiesinger et al "Looping Star" Magnetic Resonance in Med. 2019 vol. 81 p. 57-68.
Froidevaux et al "Filling the Dead Time Gap in Zero Echo Time MRI: Principles Compared" Magnetic Resonance in Med. vol. 79 p. 2036-2045 (2018).
Johnson "Hybrid Radial Cones Trajectory for Accelerated MRI" Magnetic Resonance in Med. vol. 77, p. 1068-1081 (2017).
Solana et al "Silent Multi-Echo T2 Looping Star FMRI" Proceedings of the International Soc. for Magnetic Reson. in Med. vol. 25 p. 22-27 (Apr. 2017).
T. Sam et al "A Strategy for Sampling on a Sphere Applied To 3D Selective RF Pulse Design" MRM 32 p. 778-784 (1994).
Solana et al "Looping Star a Novel Self-Refocusing Zero TE Imaging Strategy" ISMRM Oct. 23, 2018.
International Search Report and Written Opinion from PCT/EP2020/062479 dated Nov. 12, 2020.

* cited by examiner

EFFICIENT SELF-REFOCUSING ZERO ECHO TIME MR IMAGING

CROSS REFERENCE TO RELATED APPLICATIONS

This application is a U.S. national phase application of International Application No. PCT/EP2020/062479 filed on May 6, 2020, which claims the benefit of EP Application Serial No. 19173479.7 filed May 9, 2019 and is incorporated herein by reference.

FIELD OF THE INVENTION

The invention relates to the field of magnetic resonance (MR) imaging. It concerns a method of MR imaging involving a three-dimensional radial sampling of k-space. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation, and are usually not invasive.

According to the MR method in general, the body of the patient to be examined is arranged in a strong, uniform magnetic field ($B_o$ field) whose direction at the same time defines an axis (normally the z-axis) of the co-ordinate system on which the measurement is based. The magnetic field produces different energy levels for the individual nuclear magnetic spins in dependence on the magnetic field strength which can be excited (magnetic resonance) by application of an alternating electromagnetic field (RF field, also referred to as $B_1$ field) of defined frequency (Larmor frequency, or MR frequency). From a macroscopic point of view the distribution of the individual nuclear magnetic spins produces an overall magnetization which can be deflected out of the state of equilibrium by application of an electromagnetic pulse of appropriate frequency (RF pulse) while the magnetic field extends perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied RF pulse. In case of a flip angle of 90°, the nuclear magnetic spins are deflected from the z-axis to the transverse plane.

After termination of the RF pulse, the magnetization relaxes back to the original state of equilibrium, in which the magnetization in the z direction is built up again with a first time constant $T_1$ (spin-lattice or longitudinal relaxation time), and the magnetization in the direction perpendicular to the z direction relaxes with a second time constant $T_2$ (spin-spin or transverse relaxation time). The variation of the magnetization can be detected by means of one or more receiving RF coils which are arranged and oriented within an examination volume of the MR device in such a manner that the variation of the magnetization is measured in the direction perpendicular to the z-axis. The decay of the transverse magnetization is accompanied, after application of, for example, an RF pulse with a flip angle of 90°, by a transition of the nuclear magnetic spins (induced by local magnetic field inhomogeneity) from an ordered state with the same phase to a state in which all phase angles are uniformly distributed (dephasing). The dephasing can be compensated by means of a refocusing RF pulse (for example an RF pulse with a flip angle of 180°. This produces an echo signal (spin echo) in the receiving coils.

In order to realize spatial resolution in the body of the patient, linear magnetic field gradients extending along the three main axes are superposed on the uniform magnetic field, leading to a linear spatial dependency of the nuclear magnetic spins' resonance frequency. The signal picked up in the receiving coils then contains components of different frequencies which can be associated with different locations in the body of the patient. The MR signal received via the RF coils corresponds to the spatial frequency domain, which is called k-space. The data is usually collected in k-space along multiple lines acquired with different phase encoding. Each line is digitized by collecting a number of samples. A set of k-space data is converted to a MR image by means of Fourier transformation or other appropriate reconstruction algorithms.

MR imaging of tissues with very short transverse relaxation times, such as bone or lung, is becoming increasingly important. Nearly all known methods for this purpose basically employ three-dimensional (3D) radial k-space sampling. In the so-called zero echo time (ZTE) technique, a readout magnetic field gradient is set before excitation of magnetic resonance with a high-bandwidth and thus short, hard RF pulse. In this way, frequency encoding begins instantaneously upon excitation of magnetic resonance. The acquisition of the free induction decay (FID) signal along a radial k-space spoke starts immediately after the RF pulse resulting in an effectively echo time (TE) of zero. After the acquisition, only minimal time is required for setting of the next readout magnetic field gradient before the next RF pulse can be applied, thus enabling very short repetition times (TRs). The readout magnetic field gradient's direction is incrementally varied from repetition to repetition until a spherical volume in k-space is sampled to the required extent, with each of the acquired spokes starting in the k-space center. Without the need for switching off the readout magnetic field gradient between TRs, ZTE imaging can be performed virtually silently.

Recently, self-refocusing ZTE imaging has been proposed (see, e.g., US 2017/0307703 A1). In self-refocusing ZTE imaging, a gradient echo refocusing is added to the conventional ZTE imaging. Like in conventional ZTE imaging, the amplitude of the readout magnetic field gradient is kept constant and only directional updates are applied between repetitions until a full spherical volume in k-space is sampled, resulting in silent three-dimensional radial imaging. RF excitation is also achieved by short RF pulses in the presence of the readout magnetic field gradient. The self-refocusing ZTE imaging sequence is then organized in a number of (two or more) segments, and each segment is divided into a number of loops. Each loop includes the acquisition of a number of radial k-space spokes. RF excitation is performed only in the first loop (the FID acquisition loop) and not in the subsequent second and further loops (the gradient echo acquisition loops). The radial k-space spokes of each loop cumulatively form a closed trajectory in k-space. In this way, the second and further loops form gradient echoes of the initial FIDs excited in the first loop. The TEs of these gradient echoes are given by $$TE=(e-1)*N*TR,$$

wherein e is the loop counter and N is the number of radial k-space spokes acquired in each loop. TR is typically short (in the order of a 1 ms). While the amplitude of the readout magnetic field gradient is still kept constant throughout the acquisition, the directional updates applied between repetitions are typically larger than in conventional ZTE imaging. However, in order for the self-refocusing ZTE imaging sequence to remain silent, these directional updates should be as small as possible at a time.

For sampling the required spherical k-space volume, the known self-refocusing ZTE technique typically relies on a separation of the rotation of the radial k-space spokes into two rotations around orthogonal k-space axes. First, a number of segments (also referred to as interleaves) is acquired from a planar circular area in k-space representing a cross-section of the full spherical k-space volume. Within the circular area, the concatenated spokes form a closed (polygonal) k-space trajectory to enable the acquisition of gradient echoes. Then the circular area is rotated around an axis in the plane of the circular area to acquire further segments from the rotated circular area. This is continued until the full spherical k-space volume is covered. In this way, the number of spokes necessary to acquire the full spherical k-space volume is high, however, and the spokes are non-uniformly distributed, with unnecessary oversampling in some areas.

SUMMARY OF THE INVENTION

From the foregoing it is readily appreciated that there is a need for an improved method of ZTE imaging. It is an object of the invention to enable efficient silent ZTE imaging with self-refocusing.

In accordance with the invention, a method of MR imaging of an object positioned in the examination volume of a MR device is disclosed. The method of the invention comprises the steps of:
  specification of a set of radial k-space spokes to cover a spherical k-space volume;
  selection of subsets of a predetermined number of spokes from the specified set so that the concatenation of the spokes contained in each of the subsets forms a closed trajectory in k-space, wherein the selection of the subsets involves optimizing a cost function;
  subjecting the object to a zero echo time imaging sequence, wherein each of the subset of spokes is acquired as a sequence of gradient echo signals; and
  reconstructing an MR image from the acquired spokes.

According to the invention, a set of radial k-space spokes is initially specified to cover a spherical k-space volume (step a). The spherical k-space volume is determined by the desired field of view (FOV). The radial k-space spokes start, as mentioned above, in the k-space origin and end on the surface of a sphere. The minimum density of the end points of the spokes on the sphere is determined by the desired (acquired) spatial resolution of the MR image to be finally reconstructed. Many possible approaches are conceivable to determine a distribution of the end points. The initial specification of the set of radial k-space spokes has the advantage over previously known approaches that the number of spokes can be close to the minimum number of spokes required for a particular FOV and spatial resolution, thus reducing scan time. Moreover, the distribution of the end points can be more uniform, thus increasing signal-to-noise ratio (SNR).

As a next step (step b), subsets comprising a predetermined number of spokes each are selected from the specified set of radial k-space spokes. The predetermined number corresponds to the number of spokes acquired within one segment of the ZTE imaging sequence. The selection is performed in such a fashion that the concatenation of the spokes contained in each of the subsets forms a closed trajectory in k-space. This is the prerequisite for the generation of gradient echo signals as described above. Moreover, a cost function is considered in the selection procedure. The cost function preferably depends on the relative orientations of the spokes of each of the subsets. The relative orientations of the spokes basically determine the acoustic noise generated during the acquisition of these spokes. The gist of the invention is that the spokes of each of the subsets are selected (from the specified set of radial k-space spokes) such that (i) echo generation occurs and (ii) acoustic noise is minimized. In principle, any prior knowledge about the acoustic noise generated by gradient switching on a particular MR device or particular type of MR device may be incorporated into the cost function such that the generation of acoustic noise during the acquisition of the set of radial k-space spokes is penalized.

The actual acquisition of the set of radial k-space spokes with a ZTE imaging sequence is then performed in step c).

Finally, in step d), a MR image is reconstructed from the acquired radial k-space spokes.

The essential aspects of the invention are, in other words, minimizing the maximum angle between subsequently acquired spokes within the same segment, and maximizing the uniformity of the distribution of the end points of all spokes on the surface of the covered spherical k-space volume, while ensuring that the concatenation of the spokes of each subset/segment forms a closed trajectory in k-space. That is, according to the invention the subsets of spokes are selected on the basis of a cost function that drives the selection to favour smaller maximum angle between subsequent spokes, less variation of the distribution of end points under the constraint that the concatenation of spokes of each subset forms a closed trajectory in k-space.

Ideally, the selection of the predetermined number of spokes for each of the subsets is made based on the global optimum of the cost function for the entire acquisition. However, finding a local optimum that approximates the global optimum sufficiently well in a reasonable amount of computing time is often preferred. A greedy selection strategy, as known per se in the art, may be used for this purpose. It may be applied to sequentially select the individual subsets of spokes, and/or the individual or pairs of spokes for each of these subsets.

In a preferred embodiment of the invention, the selection of the subsets involves determining the sequence in which the spokes contained in each of the subsets are acquired. The acoustic noise caused by setting the readout magnetic field gradient between the acquisitions of the individual radial k-space spokes depends on the relative orientation of the subsequently acquired spokes within the same segment. Thus, the selection of the subsets should not only include the selection of the spokes to be acquired in each segment, but also their sequence.

In a preferred embodiment of the method of the invention, the set of radial k-space spokes consists of pairs of spokes having anti-parallel orientations. On this basis, the subsets can be selected to consist of pairs of spokes having anti-parallel orientations. This guarantees that the concatenation of the spokes contained in each of the subsets forms a closed trajectory in k-space and thus that gradient echoes are generated.

Not only the gradient echoes but also the FID signals may be acquired and be used to improve the reconstruction of the MR image, for example to determine the spin density and/or the spatial variation of the main magnetic field. Moreover, they enable a reduction of noise and/or of $T_2^*$ weighting. Furthermore, a correction for motion occurring between the acquisitions of the individual segments can be based on the FID signals, for example by using them as navigators for motion detection or motion compensation.

The method of the invention described thus far can be carried out by means of a MR device including at least one main magnet coil for generating a uniform steady magnetic field within an examination volume, a number of gradient coils for generating switched magnetic field gradients in different spatial directions within the examination volume, at least one RF coil for generating RF pulses within the examination volume and/or for receiving MR signals from a body of a patient positioned in the examination volume, a control unit for controlling the temporal succession of RF pulses and switched magnetic field gradients, and a reconstruction unit. The method of the invention is preferably implemented by a corresponding programming of the reconstruction unit and/or the control unit of the MR device.

The method of the invention can be advantageously carried out by most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
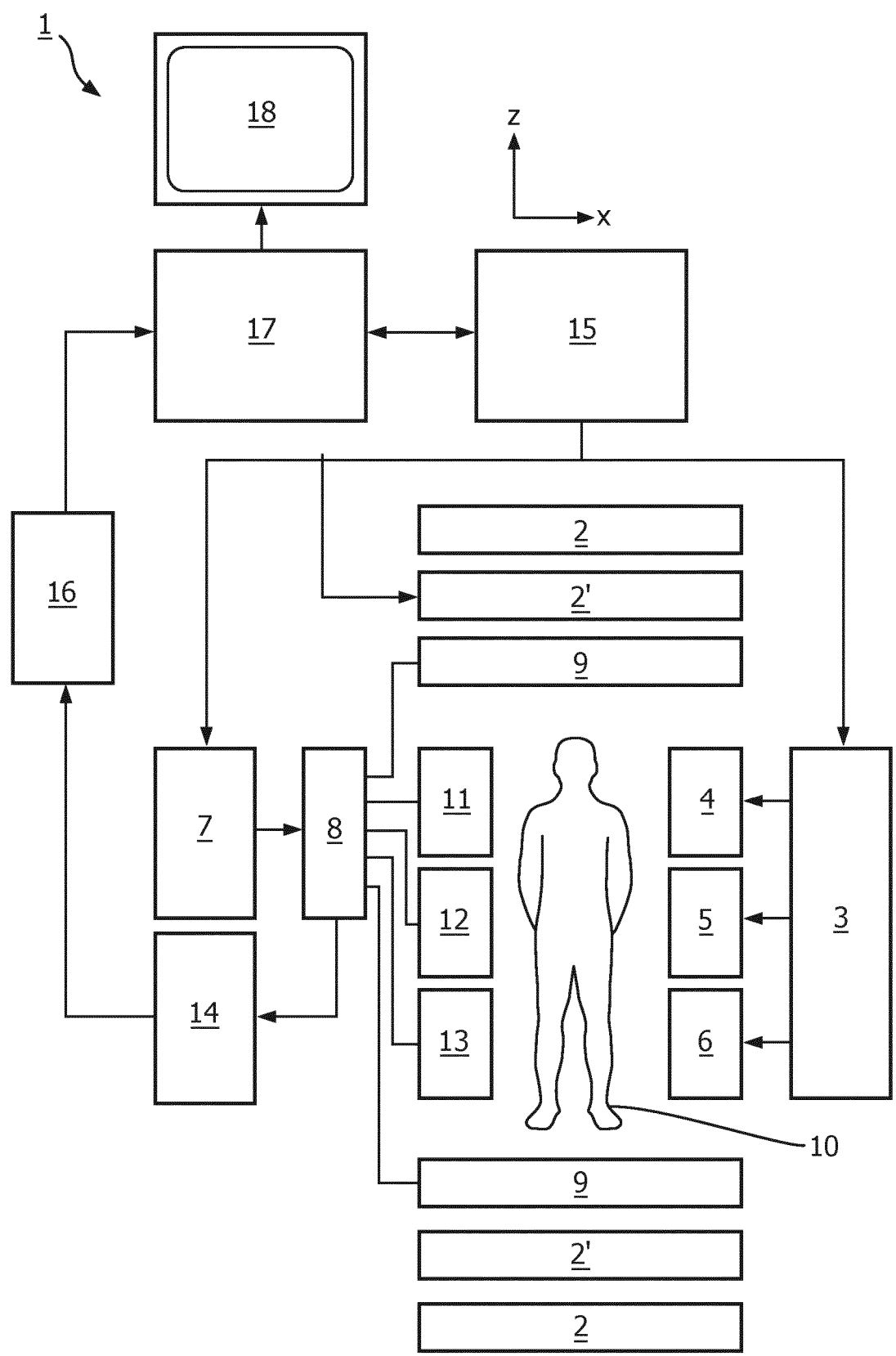
FIG. 1 schematically shows a MR device for carrying out the method of the invention.

With reference to FIG. 1, a MR device 1 which can be used for carrying out the method of the invention is shown. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to excite, invert or saturate nuclear magnetic spins, to induce, refocus, and manipulate magnetic resonance, to spatially and otherwise encode magnetic resonance, and the like to perform MR imaging.

More specifically, a gradient pulse amplifier 3 applies current pulses to selected ones of whole-body gradient coils 4, 5 and 6 along x, y and z-axes of the examination volume. A digital RF transmitter 7 transmits RF pulses, via a send/receive switch 8, to a body RF coil 9 to transmit RF pulses into the examination volume. A typical MR imaging sequence is composed of RF pulses of short duration which, taken together with any applied magnetic field gradients, achieve a selected manipulation of nuclear magnetic resonance, including the selection of a portion of a body 10 positioned in the examination volume. The MR signals are also picked up by the body RF coil 9.

For generation of MR images of a limited region of the body 10 by means of parallel imaging, a set of local array RF coils 11, 12, 13 is placed contiguous to the region to be imaged. The array coils 11, 12, 13 can be used to receive MR signals induced by RF transmissions with the body RF coil.

The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via the send/receive switch 8.

A host computer 15 controls the current flow through the shimming coils 2' as well as the gradient pulse amplifier 3 and the RF transmitter 7 to generate a ZTE imaging sequence according to the invention. The receiver 14 receives the MR signal from the individual radial k-space spokes after the RF excitation pulses in rapid succession. A data acquisition system 16 performs analog-to-digital conversion of the received MR signal and convert it to a digital format suitable for further processing. In modern MR devices the data acquisition system 16 is a separate computer which is specialized in the acquisition of raw image data.

Ultimately, the digital raw image data is reconstructed into an image representation by a reconstruction processor 17 which applies an appropriate reconstruction algorithm. The MR image represents a three-dimensional volume. The image is then stored in an image memory where it may be accessed for converting projections or other portions of the image representation into an appropriate format for visualization, for example via a video monitor 18 which provides a human-readable display of the resultant MR image.

The essence of the virtually silent ZTE technique as applied by the invention is that the RF excitation pulses are transmitted while a frequency encoding readout magnetic field gradient is switched on. The readout magnetic field gradient is not intended as a slice-selection gradient, which implies that the RF excitation pulses have to be short (typically in the order of 1 µs or 10 µs) to achieve sufficient excitation bandwidth. Alternatively, RF excitation pulses with a frequency sweep may be applied. The readout of FID signals takes place during intervals immediately after the RF excitation pulses in the presence of the readout magnetic field gradient. These intervals are also preferably short (typically in the order of 100 µs or 1 ms). The readout magnetic field gradient has a strength and a direction that both stay substantially constant over each excitation/readout cycle to acquire the MR signal from one radial k-space spoke. After each excitation/readout cycle, the direction is varied. For a full sampling of k-space, this is repeated until a spherical volume is fully covered with sufficient density.

According to the invention, self-refocusing ZTE imaging is achieved by a gradient echo refocusing mechanism. The pulse sequence is organized in a number of (two or more) segments, and each segment is divided into a number of loops. Each loop includes the acquisition of a number of radial k-space spokes. RF excitation is active only for the first loop (the FID acquisition loop) and turned off afterwards for the subsequent second and further loops (the gradient echo acquisition loops). The radial k-space spokes of each loop form a closed trajectory in k-space. In this way, the later loops form gradient echoes of the initial FIDs excited in the initial loop. With regard to the details of the self-refocusing ZTE imaging sequence adopted by the invention reference is made to US 2017/0307703 A1.

The invention proposes that, initially, a set of radial k-space spokes is specified to cover the spherical k-space volume to be acquired. In a possible embodiment, the set of spokes is specified as follows:

A sufficient number $N_P$ of parallels are defined on the surface of the k-space sphere, for example $$N_P = 2\left\lceil \frac{\pi N}{4} \right\rceil + 1,$$

where N corresponds to the diameter of the k-space sphere, discretized according to the acquired spatial resolution.

A sufficient number of end points NE are equidistantly placed along each parallel, for example $$N_E(p) = \max\left\{ 2\left\lceil \frac{\pi N \cos\left(\pi\left(p - \left\lfloor\frac{N_P}{2}\right\rfloor\right)/N_P\right)}{2} \right\rceil, 1 \right\}.$$

Figure 2:
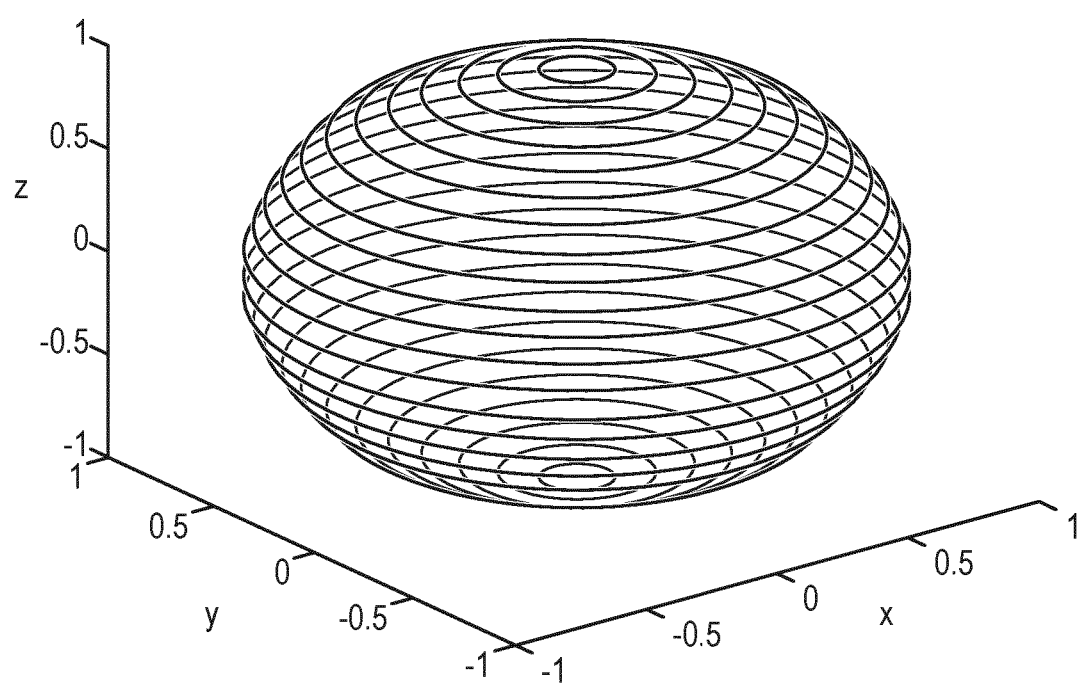
FIG. 2 illustrates the specification of a set of radial k-space spokes according to the invention.

By choosing an odd value for $N_p$ and an even value for NE, the existence of pairs of anti-parallel radial spokes is ensured. One such predefined set of end points of radial k-space spokes is plotted in the diagram of FIG. 2.

In the next step, pairs of anti-parallel spokes are selected from the specified set in an optimization. In this way, the k-space trajectory resulting from the concatenation of the radial k-space spokes of one subset, which corresponds to one acquisition segment, is guaranteed to be self-refocusing.

In the optimization, the following operations are repeated until all radial k-space spokes are assigned to one subset:

One previously unselected spoke is picked systematically or randomly from the specified set.

A cost function is evaluated for this spoke and all permutations of $N_s/2-1$ unselected spokes, where $N_s$ denotes the number of spokes in each subset.

Applying a greedy selection strategy, the optimum permutation is chosen (for which, e.g., the cost function takes on its minimum value), and the respective spokes, as well as their anti-parallel counterparts, are assigned to the current subset.

As cost function, e.g., the squared relative orientation angle between subsequent spokes can be employed in order to achieve a minimum level of acoustic noise during the ZTE acquisition.

The per se known greedy selection strategy is designed to make the locally optimum selection for each subset with the intent of finding a global optimum for the whole specified set. The greedy optimization strategy may not actually find the true globally optimum solution, but nonetheless it yields a locally optimum solution for the subsets that at least approximates the globally optimum solution in a reasonable amount of computing time. The globally optimum solution minimizes the level of acoustic noise not only for each subset, or acquisition segment, but globally for the whole specified set, or the entire acquisition.

However, any known heuristic algorithm for an efficient, but approximate search for the optimal permutation may be applied instead of the greedy selection strategy. In particular, the search may be stopped whenever a predefined maximum of the relative orientation angle between subsequent spokes within a segment is met.

Figure 3:
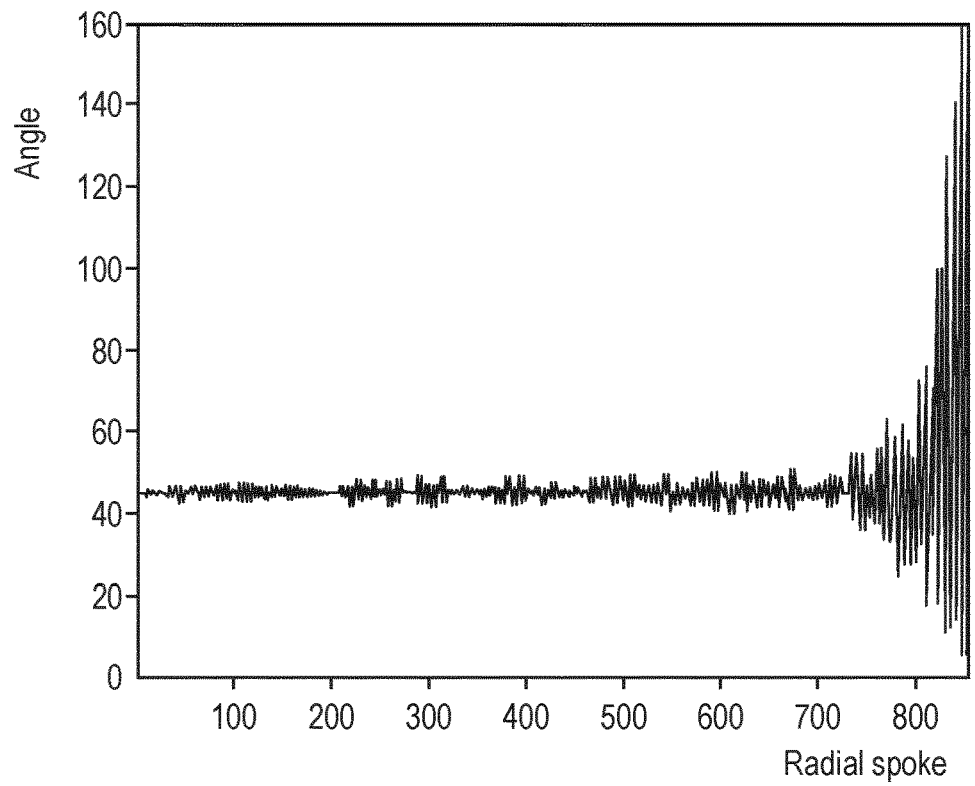
FIG. 3 shows a diagram indicating the relative orientation angles between successively acquired spokes according to the invention.

A representative result obtained with the afore-described procedure is provided in FIG. 3. Eight spokes per subset were chosen in this example, with an optimal angle between subsequent spokes of 45°. Using the greedy selection strategy, the actual angle between subsequent spokes is close to the optimum for most of the spokes. Only towards the end of the procedure, the choice of remaining unselected spokes becomes very limited, and the angle between subsequent spokes substantially exceeds the optimum.

Figure 4:
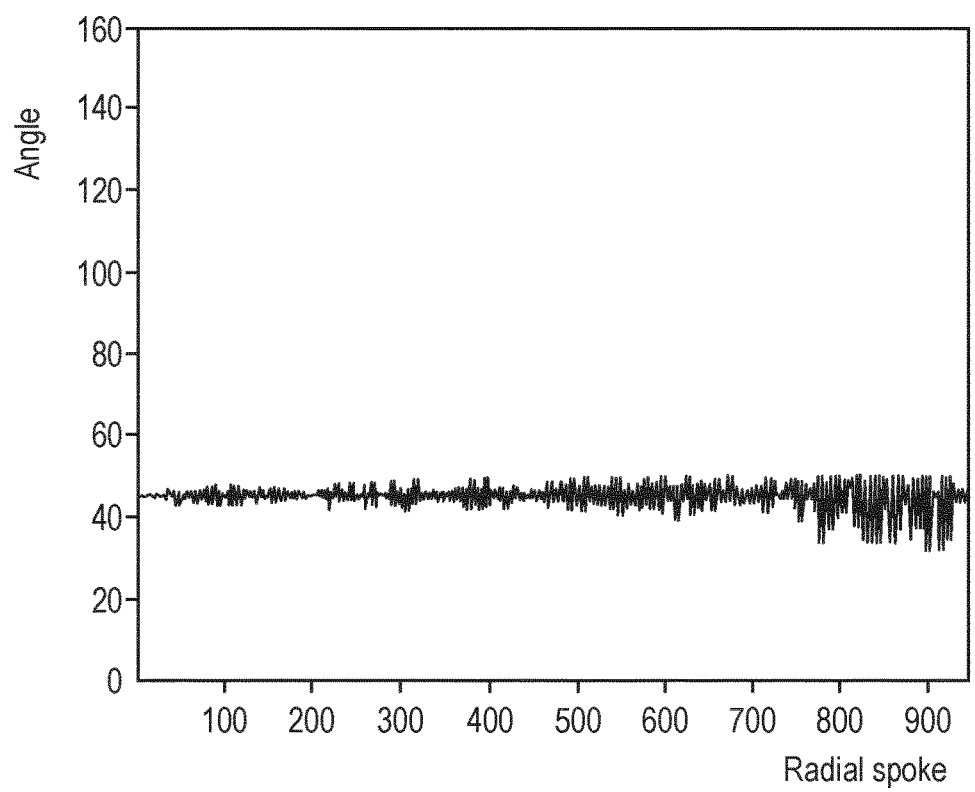
FIG. 4 shows a further diagram indicating the relative orientation angles between successively acquired spokes according to another embodiment of the invention.

If a predefined maximum of the relative orientation angle between subsequent spokes within a subset cannot be met anymore, spokes may be added, at the expense of a small increase in the required number of spokes and a corresponding small increase of scan time. This is demonstrated in FIG. 4, where a re-acquisition of spokes was permitted, i.e. some spokes were assigned to a subset that had already been selected for a previous subset. This re-selection of spokes was allowed if the relative orientation angle exceeded 50°, leading to an increase of 13% of the total number of spokes.

The invention claimed is:

1. A computer-implemented method of magnetic resonance (MR) imaging of an object positioned in an examination volume of a MR device, the method comprising:
    specifying a set of radial k-space spokes to cover a spherical k-space volume, such that spokes of the set of radial k-space spokes extend from a k-space origin in the spherical k-space volume to end points distributed on a surface of the spherical k-space volume;
    automatically selecting subsets of spokes from the specified set of radial k-space spokes, with each subset comprising a predetermined number of spokes from the specified set of radial k-space spokes so that concatenation of the spokes in each of the subsets forms a closed trajectory in k-space, wherein selecting the subsets is based on optimizing a cost function favouring (i) minimizing a maximum angle between subsequently acquired spokes within the same subset, (ii) maximizing a uniformity of the distribution of the end points of the spokes on the surface of the spherical k-space volume, and penalizing a level of acoustic noise generated during acquisition of the subsets, while ensuring that the concatenation of the spokes of each of the subsets forms the closed trajectory in k-space;
    performing a zero echo time imaging sequence of the object, wherein each of the subsets is acquired as a sequence of gradient echo signals;
    reconstructing an MR image from the acquired spokes; and
    providing a human-readalbe display of reconstructed MR image.

2. A computer-implemented method of magnetic resonance (MR) imaging of an object positioned in an examination volume of a MR device, the method comprising:
    specifying a set of radial k-space spokes to cover a spherical k-space volume, such that spokes of the set of radial k-space spokes extend from a k-space origin in the spherical k-space volume to end points distributed on a surface of the spherical k-space volume;

automatically selecting subsets of spokes from the specified set of radial k-space spokes, with each subset comprising a predetermined number of spokes from the specified set of radial k-space spokes so that concatenation of the spokes in each of the subsets forms a closed trajectory in k-space, wherein selecting the subsets involves determining a sequence in which the spokes in each of the subsets are acquired, and wherein selecting the subsets is based on optimizing a cost function favouring (i) minimizing a maximum angle between subsequently acquired spokes within the same subset, and (ii) maximizing a uniformity of the distribution of the end points of the spokes on the surface of the spherical k-space volume, while ensuring that the concatenation of the spokes of each of the subsets forms the closed trajectory in k-space;

performing a zero echo time imaging sequence of the object, wherein each of the subsets is acquired as a sequence of gradient echo signals;

reconstructing an MR image from the acquired spokes; and providing a human-readable display of reconstructed MR image.

3. A computer-implemented method of magnetic resonance (MR) imaging of an object positioned in an examination volume of a MR device, the method comprising:

specifying a set of radial k-space spokes to cover a spherical k-space volume, wherein the set of radial k-space spokes consists of pairs of spokes having anti-parallel orientations;

automatically selecting subsets of spokes from the specified set of radial k-space spokes, with each subset comprising a predetermined number of spokes from the specified set of radial k-space spokes so that concatenation of the spokes in each of the subsets forms a closed trajectory in k-space, wherein selecting the subsets is based on optimizing a cost function favouring (i) minimizing a maximum angle between subsequently acquired spokes within the same subset, and (ii) maximizing a uniformity of distribution of end points of the spokes on a surface of the spherical k-space volume, while ensuring that the concatenation of the spokes of each of the subsets forms the closed trajectory in k-space;

performing a zero echo time imaging sequence of the object, wherein each of the subsets is acquired as a sequence of gradient echo signals;

reconstructing an MR image from the acquired spokes; and providing a human-readable display of reconstructed MR image.

4. A magnetic resonance (MR) device comprising:

at least one main magnet coil for generating a uniform, static magnetic field within an examination volume;

a number of gradient coils for generating switched magnetic field gradients in different spatial directions within the examination volume;

at least one RF coil for generating RF pulses within the examination volume and/or for receiving MR signals from an object positioned in the examination volume;

a control unit for controlling a temporal succession of RF pulses and switched magnetic field gradients, wherein the control unit is configured to:

specify a set of radial k-space spokes to cover a spherical k-space volume, such that spokes of the set of radial k-space spokes are between a k-space origin and end points distributed on a surface of the spherical k-space volume;

select subsets of a predetermined number of spokes from the specified set radial k-space spokes so that concatenation of the spokes in each of the subsets forms a closed trajectory in k-space, wherein selecting the subsets is based on a cost function is based on optimizing a cost function favouring (i) minimizing a maximum angle between subsequently acquired spokes within the same subset, (ii) maximizing the uniformity of the distribution of the end points of the spokes on the surface of the spherical k-space volume, while ensuring that the concatenation of the spokes of the subsets forms the closed trajectory in k-space; and perform a zero echo time imaging sequence of the object, wherein each of the subsets is acquired as a sequence of gradient echo signals;

a reconstruction unit configured to reconstruct an MR image from the acquired spokes; and a video monitor configured to provide a human-readable display of the reconstructed MR image.

5. A non-transitory computer readable medium storing instructions that, when executed by at least one computer, cause the at least one computer to:

specify a set of radial k-space spokes to cover a spherical k-space volume, such that spokes of the set of radial k-space spokes are between a k-space origin and end points distributed on a surface of the spherical k-space volume;

select subsets of a predetermined number of spokes from the specified set of radial k-space spokes so that concatenation of the spokes contained in each of the subsets forms a closed trajectory in k-space, wherein selecting the subsets is based on a cost function favouring (i) minimizing a maximum angle between subsequently acquired spokes within the same_subset, (ii) maximizing a uniformity of the distribution of the end points of the spokes on the surface of the spherical k-space volume, while ensuring that the concatenation of the spokes of each of the subsets forms the closed trajectory in k-space;

generate a zero echo time imaging sequence, wherein each of the subsets is acquired as a sequence of gradient echo signals;

reconstruct an MR image from the acquired spokes; and cause the reconstructed MR image to be displayed on a video monitor.

6. The method of claim 2, wherein the cost function depends on relative orientations of the subsequently acquired spokes within the same subset.

7. The method of claim 3, wherein each of the subsets is selected to consist of at least one pair of spokes having anti-parallel orientations.

8. The method of claim 1, wherein a greedy selection strategy is used in a sequential selection of the subsets.

9. The method of claim 1, wherein a greedy selection strategy is used in a sequential selection of individual spokes or pairs of spokes for each of the subsets.

10. The MR device of claim 4, wherein the control unit is configured to select the subsets further based on determining a sequence in which the spokes contained in each of the subsets are acquired.

11. The MR device of claim 4, wherein the cost function penalizes a level of acoustic noise generated during acquisition of the subsets of spokes.

12. The MR device of claim 4, wherein the set of radial k-space spokes consists of pairs of spokes having anti-parallel orientations.

13. The MR device of claim 4, wherein a greedy selection strategy is used in a sequential selection of individual subsets of spokes or a sequential selection of individual or pairs of spokes for each of the subsets.

14. The computer readable medium of claim 5, wherein selecting the subsets involves determining a sequence in which the spokes in each of the subsets are acquired.

15. The computer readable medium of claim 14, wherein the cost function depends on the relative orientations of subsequently acquired spokes from the same subset.

16. The computer readable medium of claim 5, wherein the cost function penalizes a level of acoustic noise generated during acquisition of the subsets of spokes.

17. The computer readable medium of claim 5, wherein the set of radial k-space spokes consists of pairs of spokes having anti-parallel orientations.

18. The computer readable medium of claim 17, wherein each of the subsets is selected to consist of at least one pair of spokes having anti-parallel orientations.

19. The computer readable medium of claim 5, wherein the instructions cause the at least one computer to use a greedy selection strategy in a sequential selection of the subsets of spokes.

20. The computer readable medium of claim 5, wherein the instructions cause the at least one computer to use a greedy selection strategy in a sequential selection of individual or pairs of spokes for each of the subsets.

* * * * *